United States Patent
Yang et al.

(10) Patent No.: US 9,453,875 B2
(45) Date of Patent: Sep. 27, 2016

(54) MULTI-STAGE CIRCUIT BOARD TEST

(71) Applicant: Dell Products L.P., Round Rock, TX (US)

(72) Inventors: Chun Feng Yang, Shanghai (CN); Ying Qi, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 389 days.

(21) Appl. No.: 14/058,440

(22) Filed: Oct. 21, 2013

(65) Prior Publication Data

US 2015/0109012 A1    Apr. 23, 2015

(51) Int. Cl.
*G01R 31/00* (2006.01)
*G01R 31/28* (2006.01)

(52) U.S. Cl.
CPC ................................ *G01R 31/2808* (2013.01)

(58) Field of Classification Search
CPC .......... G01R 31/2808; G01R 31/2851; G01R 31/2889
USPC ........................................... 324/750.1–750.3
See application file for complete search history.

(56) References Cited

U.S. PATENT DOCUMENTS

| | | | |
|---|---|---|---|
| 5,027,063 A * | 6/1991 | Letourneau .......... | G01R 1/0483 324/750.2 |
| 5,311,120 A | 5/1994 | Bartholomew | |
| 6,535,008 B1 | 3/2003 | Casale | |
| 7,200,509 B2 | 4/2007 | Adams et al. | |
| 2013/0271171 A1* | 10/2013 | Adams ............... | G01R 31/2808 324/750.25 |

* cited by examiner

*Primary Examiner* — Farhana Hoque
(74) *Attorney, Agent, or Firm* — Terrile, Cannatti, Chambers & Holland, LLP; Robert W. Holland

(57) ABSTRACT

Multi-stage in circuit test of a circuit board has support to reduce strain placed on the circuit board during each test stage. A shuttle plate is disposed between a load plate that supports a circuit board under test and a probe plate that directs test probes towards the circuit board. The shuttle board slides between different positions with each position establishing the distance between the circuit board and the test probes. For instance, in a first position, the shuttle plate aligns intermediary members to rest between the load plate and shuttle plate to keep the probes spaced by a first distance from the circuit board so that only some test probes contact the circuit board. In a second position, the shuttle plate aligns the intermediary members with blind vias to bring the shuttle plate and load plate proximate each other so that all test probes contact the circuit board.

14 Claims, 4 Drawing Sheets

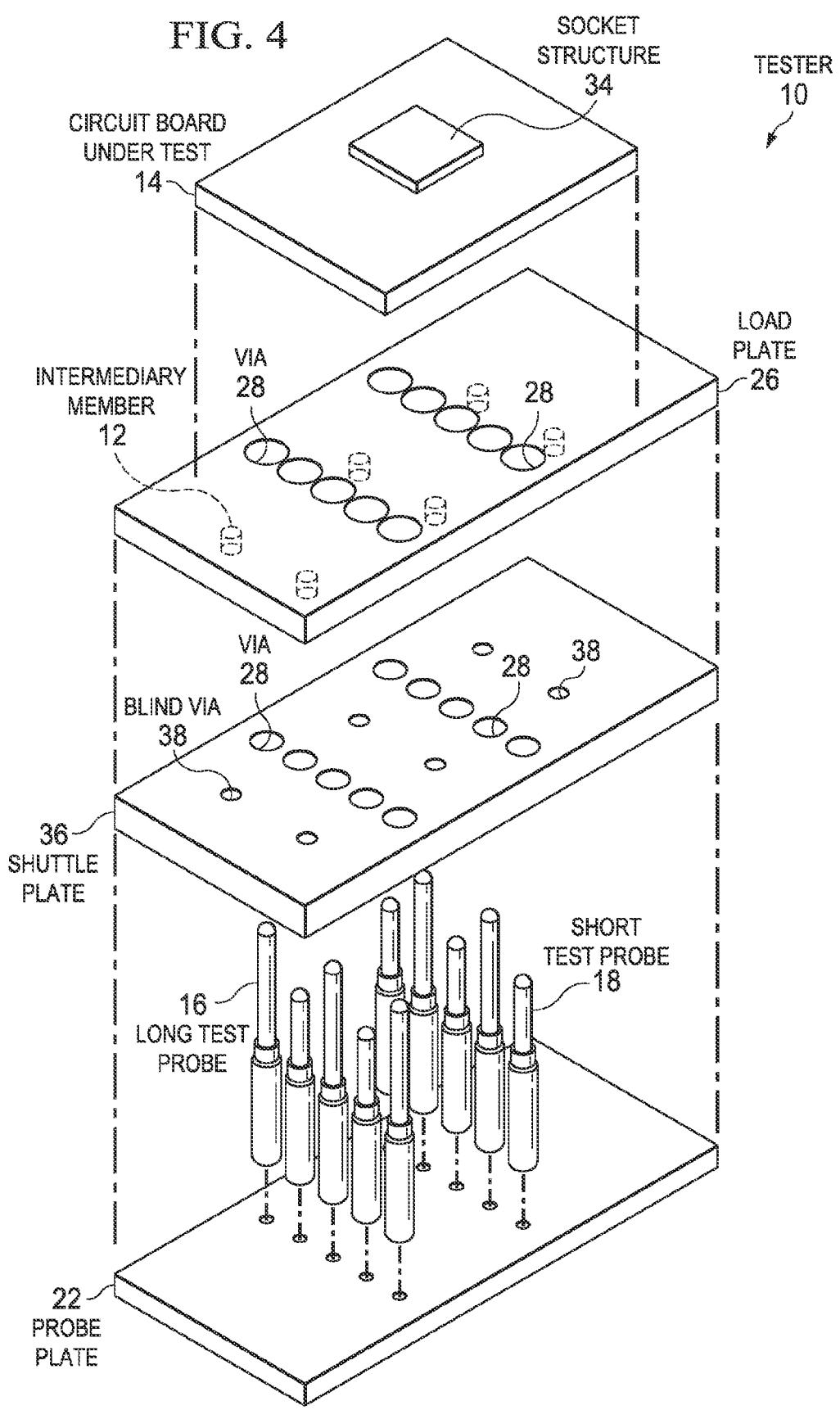

MULTI-STAGE CIRCUIT BOARD TEST

BACKGROUND OF THE INVENTION

1. Field of the Invention

The present invention relates in general to the field of information handling system circuit board test, and more particularly to a multi-stage in circuit test with strain management.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are typically built from a variety of components that communicate through a circuit board, such as a printed circuit board (PCB). The circuit board communicates signals, power and ground through wire lines formed in a nonconductive material, such as copper wires printed in laminated layers of plastic. Once the wire lines are prepared and the circuit board lamination is complete, electronic components are connected to the circuit boards in defined positions, such as by soldering electronic components to exposed connection points on the circuit boards. Often, processors and other large components are coupled to the circuit board with sockets that have mechanical coupling devices to hold processors in place. For example, a ball grid array (BGA) socket solders into a circuit board to establish electrical communication between wire lines of the circuit board and balls laid out on the socket surface. A processor is placed over the balls so that processor contacts interface with the balls and, in turn, with the circuit board wire lines. A load mechanism placed over the processor presses against the top of the processor to hold the processor contacts in place relative to the socket balls.

Circuit boards generally represent a small portion of the overall cost of an information handling system, however, if a circuit board includes a fault then the more expensive components will often fail in unpredictable manners. For this and other reasons, circuit boards are typically tested for faults before assembly of components to the circuit board with a process generally referred to as in circuit testing (ICT). During in circuit testing, electrical probes test a circuit board to check for faults such as shorts, opens, resistance, capacitance and other indicators that will show whether the circuit board is correctly fabricated. Generally, a "bed of nails" configuration of probes is brought into contact with testing pads formed on the circuit board. Probes are brought into contact with testing nodes by pressing the circuit board against the probes. Typically, the circuit board is brought into contact with probes by creating a vacuum in a test space that pulls the circuit board downward into the probes, such as with the Agilent i3070 tester. In some cases, the circuit board is tested in multiple stages by stopping the circuit board's vacuum-induced motion after a first distance to provided contact with a first set of spring-loaded probes, and then removing the stops to allow the vacuum to pull the circuit board downwards into a second set of probes. The first set of probes is longer than the second set of probes and include spring loading so that the first set of probes recede downward with the circuit board as the board lowers against the second set of probes.

In order to varying the distance that a circuit board travels during testing, stops are typically inserted along the edges of the load plate at the point where the first set of probes contact the circuit board. After completion of testing by the first set of probes, the stops are withdrawn to allow the circuit board to move so that the vacuum pulls the circuit board downward to the second set of probes. One difficulty that arises in such multi-stage testing is that, during the first stage of testing, the vacuum exerts a force across the circuit board and load plate that introduces flexion distal the stops. The downward force tends to bow the circuit board about its center point, which introduces strain to the circuit board. Strain across the circuit board transfers to wire lines and solder so that cracks and other faults may develop as a result of the testing. The amount of strain increases as the surface area of the circuit board increases and the thickness of the circuit board decreases. In some instances, a bent circuit board becomes unsuitable for use in an information handling system. In other instances, cracks form at socket joints and in other portions of the socket as the circuit board flexes relative to a stiff socket structure.

SUMMARY OF THE INVENTION

Therefore, a need has arisen for a system and method which supports a circuit board test at multiple stages with reduced circuit board strain.

In accordance with the present invention, a system and method are provided which substantially reduce the disadvantages and problems associated with previous methods and systems for circuit board testing. Intermediate members provide support to a circuit board under test at intermediate test stages and then recede to allow full movement of the circuit board in a test chamber for a final test stage.

More specifically, an in circuit tester brings a circuit board into first and second test positions relative to a test probe plate that has test probes of first and second heights. In a first test stage, intermediate members intercede with the movement of the circuit board to maintain the circuit board at a height that allows connection of a first set of test probes to the circuit board but not connection of a second set of test probes. In a second test stage, the intermediate members recede or otherwise provide for additional movement of the circuit board so that both the first and second set of probes contact the circuit board. In one embodiment, the intermediate members extend from a load plate that supports the circuit board towards a shuttle plate to rest on the shuttle plate surface in the first test stage. The shuttle plate slides relative to the load plate to align the intermediate members with blind vias formed in the shuttle plate so that the intermediate member recede into the blind vias to allow additional circuit board motion. The intermediate members are distributed across the bottom surface of the load plate to support the load plate evenly so that stress is not unduly introduced to the circuit board during testing.

The present invention provides a number of important technical advantages. One example of an important technical advantage is that circuit board tests are performed at multiple stages with support provided across the surface of the circuit board at each stage to reduce the introduction of strain to circuit board connection points. A shuttle plate intercedes between the tester lower probe support surface and circuit board under test to provide support across the surface of the circuit board at multiple test stages. Vias formed in the shuttle plate pass through a first set of probes that interface with the circuit board at a first test stage and a second set of probes that interface with the circuit board at a second test stage. Intermediate stop beans support the circuit board under test during interaction with just the first set of probes. Moving the shuttle plate relative to the circuit board aligns the intermediate stop beans with blind vias of the shuttle plate to allow circuit board motion into position for contact with the second set of probes. The intermediate stop beans prevent excessive strain across the circuit board at the first test stage to prevent circuit board failures during test.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 4 depicts a blow-up top view of an example of a multi-stage tester having a sliding shuttle plate to selectively engage intermediary members.

DETAILED DESCRIPTION

Information handling system multi-stage circuit board testing is performed with intermediate supports that reduce the risk of strain-related damage tai the circuit boards during testing. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
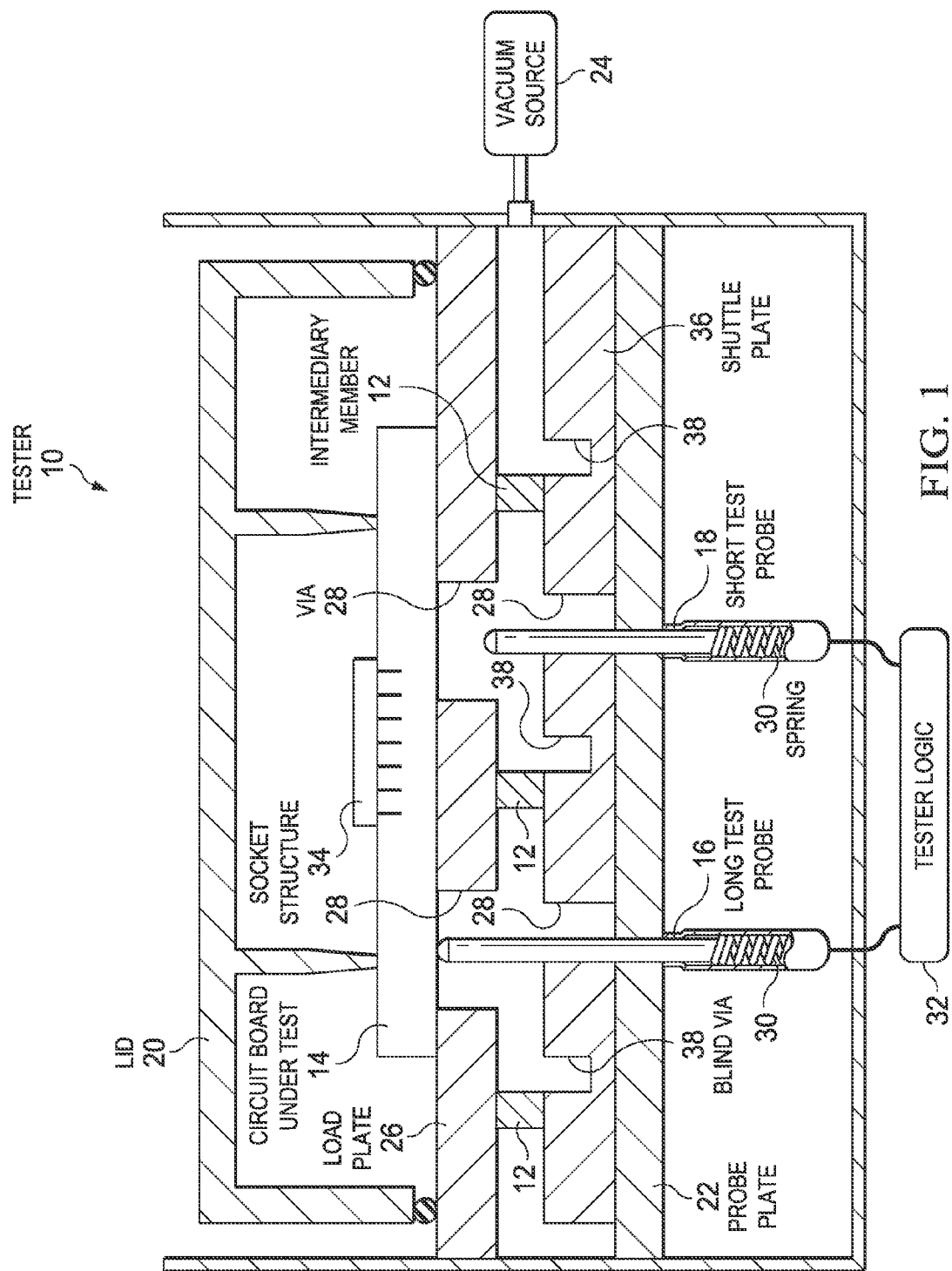
FIG. 1 depicts a side cutaway view of a multi-stage circuit board tester having an intermediary member to provide circuit board support at an intermediary test stage.

Referring now to FIG. 1, a side cutaway view depicts a multi-stage circuit board tester 10 having an intermediary member 12 to provide circuit board 14 and load plate 26 with support at an intermediary test stage. In the example embodiment, an in circuit tester (ICT) selectively engages long test probes 16 and short test probes 18 with circuit board 14 during multiple testing stages. Tester 10 forms a container with a lid 20 that moves vertically relative to a probe plate 22 at the base of tester 10. A vacuum source 24 generates a vacuum within tester 10 to bias lid 20 in a downward direction against a load plate 26. Load plate 26 supports circuit board 14 during test and brings circuit board 14 into contact with test probes 16 and 18 by providing downward motion in response to a bias of lid 20. Test probes 16 and 18 pass through via openings 28 formed in load plate 26 to come into contact with testing pads formed in circuit board 14. Springs 30 associated with probes 16 and 18 maintain contact between probes 16 and 18 and circuit board 14 by providing a biasing upward force. Long test probe 16 moves downward to the level of short test probe 18 as circuit board 14 moves toward probe plate 22 so that both long test probe 16 and short test probe 18 are in contact with circuit board 14 as load plate 26 approaches probe plate 22.

During a first test stage, load plate 26 lowers by a distance sufficient to bring circuit board 14 in contact with long test probes 16 but insufficient to bring circuit board 14 into contact with short test probes 18. Tester logic 32 provides test signals through long test probe 16 during the first test stage, while short test probe 18 remain idle. After first stage tests are complete, load plate 26 lowers further towards probe plate 22 so that both long test probes 16 and short test probes 18 are in contact with circuit board 14 to allow a second test stage. Tester logic 32 provides test signals through both long test probe 16 and short test probe 18 during the second test stage. The example embodiment is simplified for illustration purposes by show just a single long and short test probe, while ICT testers typically include a bed of test probes of different lengths.

Generally, as circuit board 14 is pulled down towards probe plate 22, load plate 26 will flex and thereby introduce strain to circuit board 14. Flexing of circuit board 14 can result in the creation of defects as solder or wire lines bend and crack, especially if solid structures are couple to circuit board 14, such as a processor socket structure 34. In order to reduce stress across circuit board 14, intermediate members 12 disposed between probe plate 22 and load plate 26 provide additional support that prevents or reduces flexing of load plate 26. For example, intermediate members 12 have a length that allows support of load plate 26 translated from probe plate 22 when long test probe 16 engages circuit board 14 at a first test stage. Once the first test stage is complete, intermediate members 12 are removed or otherwise neutralized to allow movement of load plate 26 to a second test stage at which probe plate 22 more directly translates support to load plate 26. In various embodiments, intermediate members may retract into probe plate 22, rotate to a shorter profile, retract into load plate 26 or otherwise alter their footprint within tester 10, such as in the example embodiment depicted by FIGS. 2 through 4 as set forth below.

Figure 2:
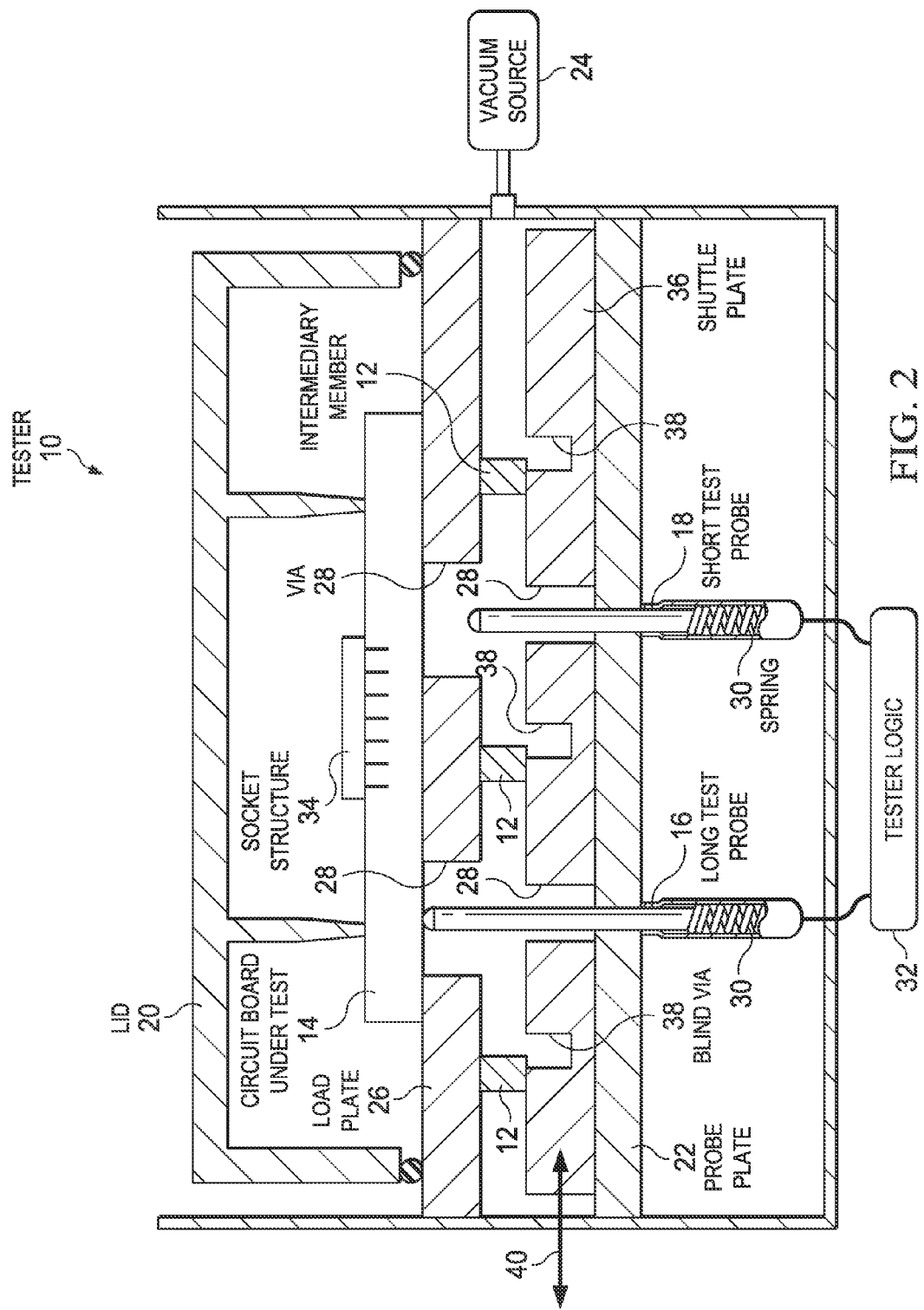
FIG. 2 depicts an example embodiment of a multi-stage tester having a sliding shuttle plate with stop bean intermediary members to provide circuit board support during testing by long test probes.

Referring now to FIG. 2, an example embodiment is depicted of a multi-stage tester 10 having a sliding shuttle plate 36 with stop bean intermediary members 12 to provide load plate 26 with support during testing by long test probes 16. At a first test stage, vacuum within tester 10 pulls lid 20 towards probe plate 22 to bring long test probes 16 into contact with circuit board 14. Before load plate 26 lowers by a distance sufficient to bring short test probes 18 into contact with circuit board 14, intermediate stop bean members 14 intervene to stop movement of load plate 26 by resting on the upper surface of a shuttle plate 36. Intermediate stop bean members are distributed on the bottom surface of load plate 26 to reduce the risk of flexing of load plate 26 at the first test stage. In one example embodiment, intermediate stop bean members 12 are coupled to the bottom surface of load plate 26 in a pattern that provides additional support at sensitive locations of circuit board 14, such as at the location of structures like processor sockets soldered to circuit board 14. The force exerted against intermediate stop bean members 12 at the first test stage is translated through shuttle plate 36 to probe plate 22.

Shuttle plate 36 includes vias 28 that allow test probes to pass through from probe plate 22 towards circuit board 14. Vias 28 are formed with sufficient room to allow a sliding motion of shuttle plate 36, as indicated by motion arrow 40, without having shuttle plate 36 interfere with test probes 16 and 18. Intermediate stop bean members 12 have a height sufficient to maintain load plate 26 above short test probes 18 during first stage testing but short enough so that long test probes 16 contact circuit board 14. Upon introduction of a lateral sliding motion of shuttle plate 36 relative to load plate 26, intermediate stop bean members 12 align with blind vias formed in shuttle plate 36 to allow further movement of load plate 26 towards probe plate 22 so that short test probes 18 come into contact with circuit board 14 to allow second stage testing. In the second stage testing, circuit board 14 is prevented from excessive flexing by support translated from probe plate 22, through shuttle plate 36 and load plate 26.

Figure 3:
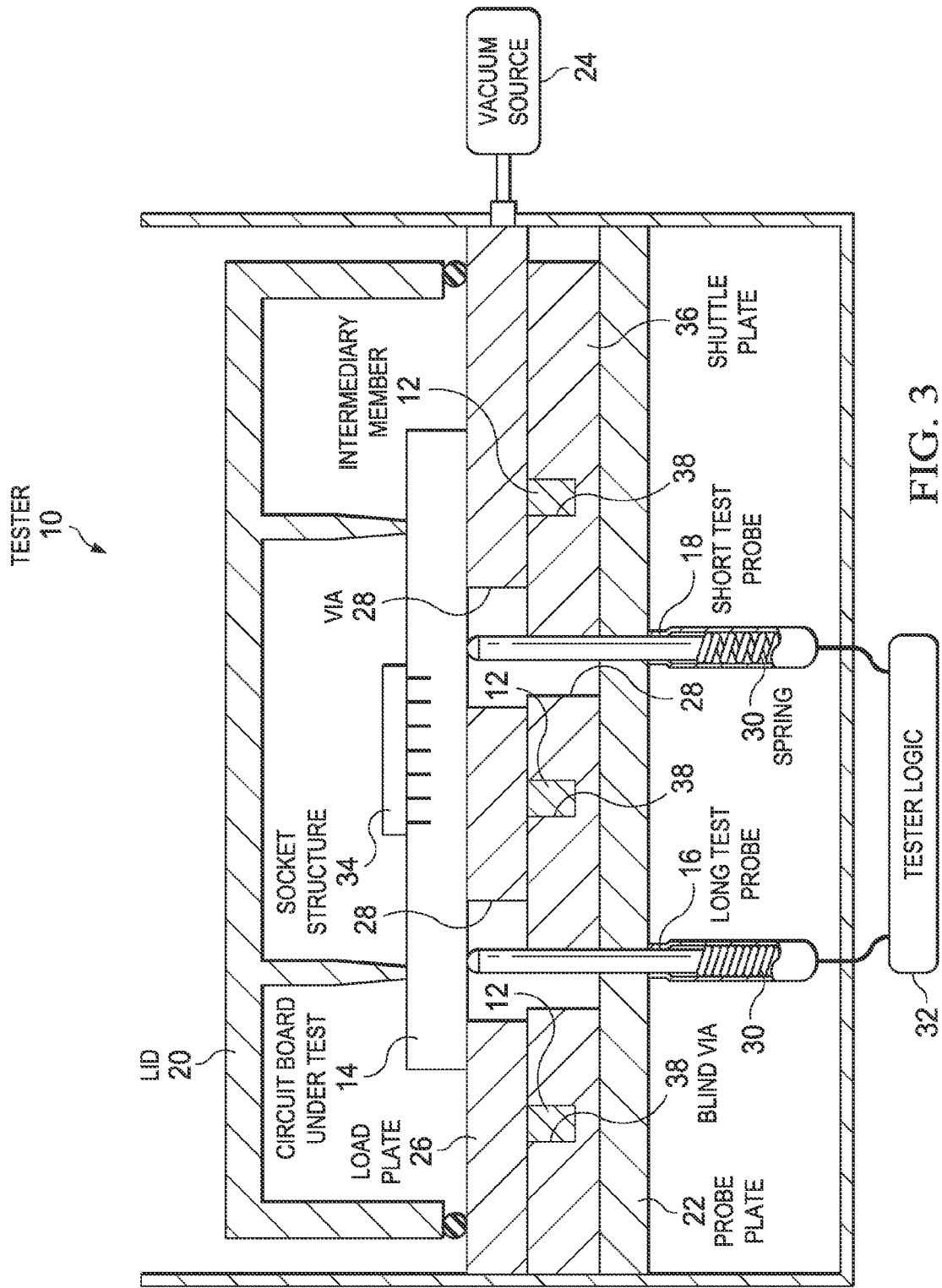
FIG. 3 depicts the multi-stage tester of FIG. 2 having the shuttle plate slid relative to the load plate so that the stop bean intermediary members engage in blind vias of the shuttle board.

Referring now to FIG. 3, the multi-stage tester 10 of FIG. 2 is depicted having the shuttle plate 36 slid relative to the load plate 26 so that the stop bean intermediary members 12 engage in blind vias 38 of the shuttle plate 36. Although the example embodiment extends intermediate members 12 from the bottom of load plate 26 that selectively recede within blind vias 28 of shuttle plate 36, in alternative embodiments other types of intermediate structure members may be used. For instance, intermediate members 12 by couple to shuttle plate 36 and extend upwards to selectively recede into blind vias of load plate 26. Alternatively, intermediate members 12 may be disposed between shuttle plate 36 and probe plate 22 and selectively recede into blind vias formed in either the bottom surface of shuttle plate 36 or the top surface of probe plate 22. In one embodiment, a ball bearing embedded in each intermediate member 12 aids motion of shuttle plate 36 by reducing friction imposed by force applied from lid 20 under vacuum. In other embodiments, intermediate members 12 may recede into full vias instead of blind vias, or may recede into openings formed in the plate from which the intermediate extends. For example, shuttle plate 36 may include intermediate members that retract and extend from shuttle plate 36 rather than having mating members and blind vias in opposing plates.

Referring now to FIG. 4, a blow-up top view depicts an example of a multi-stage tester 10 having a sliding shuttle plate 36 to selectively engage intermediary members 12. Probe plate 22 has a bed of long and short probes 16 and 18 that extend upwards at plural heights. Shuttle plate 36 slides laterally relative to probe plate 22 and load plate 26, and includes vias 28 that allow probes 16 and 18 to pass through. In the example, vias 28 are open block areas that have dimensions sufficient to allow probes 16 and 18 to pass through in each position that shuttle plate 36 slides between. Blind vias 38 are formed to align with intermediate members 12 in stage two testing but to be out of alignment with intermediate members 12 in stage one testing. Load plate 26 is depicted to have smaller vias 28 than those of shuttle plate 36 since load plate 26 of the example embodiment does not move relative to probes 16 and 18. Intermediate members 12 are depicted on load plate 26 but assemble to intercede between load plate 26 and shuttle plate 36 as described above. Circuit board 14 rests stationary on load plate 26, which selectively rests on intermediate members 12 in stage one testing or directly on shuttle plate 36 in stage two testing. Shuttle plate 36 in turn rests on probe plate 22 so that support is provided to circuit board 14 through the interactive structure. In alternative embodiments, support may be provided to specific areas of circuit board 14 by varying the structure of shuttle plate 36, such as by aligning intermediate members at the periphery of socket 34 to reduce the risk of movement proximate the socket.

Although the present invention has been described in detail, it should be understood that various changes, substitutions and alterations can be made hereto without departing from the spirit and scope of the invention as defined by the appended claims.

What is claimed is:

1. A circuit board tester comprising:
   a probe plate;
   a first set of test probes extending from the probe plate and having a first length;
   a second set of test probes extending from the probe plate and having a second length;
   a load plate to support a circuit board under test, the load plate having plural openings to pass through the first and second sets of test probes;
   a shuttle plate disposed between the load plate and the probe plate, the shuttle plate having plural openings to pass through the first and second sets of test probes; and
   intermediary members disposed between the load plate and the shuttle plate, the intermediary members having an extended position to maintain a first predetermined distance between the load plate and shuttle plate, and having a receded position to maintain a second predetermined distance between the load plate and the shuttle plate;
   wherein:
   the intermediary members include at least four members disposed proximate each corner of a socket integrated in the circuit board;
   the first predetermined distance brings the first set of test probes into contact with the circuit board but not the second set of test probes;
   the second predetermined distance brings both the first and second sets of test probes into contact with the circuit board;
   the intermediary members comprise plural structures extending from the load plate towards the shuttle plate and the receded position comprises insertion of the plural structures into openings formed in the shuttle plate; and
   the shuttle plate selects the extended position or the receded position by sliding relative to the load plate.

2. The circuit board tester of claim 1 wherein the intermediary members comprise plural structures extending from the shuttle plate towards the load plate and the receded position comprises insertion of the plural structures into openings formed in the load plate.

3. The circuit board tester of claim 2 wherein the shuttle plate selects the extended position or the receded position by sliding relative to the load plate.

4. The circuit board tester of claim 1 further comprising:
a lid disposed over the circuit board; and
a vacuum source operable to generate a vacuum, the vacuum biasing the lid towards the probe plate, the lid transferring the biasing to the circuit board.

5. A method for testing a circuit board, the method comprising:
supporting a circuit board on a load plate disposed in a tester;
moving the load plate towards a probe plate to bring a first set of test probes in contact with the circuit board;
maintaining a predetermined distance between the probe plate and load plate with plural intermediary members disposed at a first location relative to a shuttle plate disposed between the load plate and the probe plate, the predetermined distance bringing the first set of test probes into contact with the circuit board but not a second set of test probes;
moving the shuttle plate relative to the plural intermediary members to a second location between the load plate and the probe plate by sliding the shuttle plate, the plural intermediary members having plural structures extending from the load plate towards the shuttle plate, the intermediary members having an extended position to maintain the first predetermined distance and a receded position to maintain the second predetermined distance, the receded position having insertion of the plural structures into openings formed in the shuttle plate; and
in response to moving the shuttle plate, moving the load plate towards the probe plate to bring the second set of test probes in contact with the circuit board, the first set of test probes remaining in contact with the circuit board;
wherein the intermediary members include at least four members disposed proximate each corner of a socket integrated in the circuit board.

6. The method of claim 5 wherein the moving the load plate further comprises:
applying a vacuum at the tester; and
biasing the load plate towards the probe plate in response to applying a vacuum.

7. The method of claim 5 wherein moving the plural intermediary members further comprises:
sliding a shuttle plate disposed between the load plate and the probe plate from a first position to a second position; and
inserting the intermediary members in openings at the second position, the inserting the intermediary members from blocking movement of the load plate relative to the probe plate.

8. The method of claim 7 wherein intermediary members extend from the load plate towards the shuttle plate and insert in blind vias formed in the shuttle plate.

9. The method of claim 7 wherein the intermediary members extend from the shuttle plate towards the load plate and insert in blind vias formed in the load plate.

10. The method of claim 7 wherein the intermediary members extend from the probe plate towards the shuttle plate and insert in blind vias formed in the shuttle plate.

11. The method of claim 7 wherein the intermediary members extend from the shuttle plate towards the probe plate and insert in blind vias formed in the probe plate.

12. A system for testing a circuit board, the system comprising:
a tester having plural probes of plural lengths;
a load plate disposed in the tester to support a circuit board under test;
a shuttle plate disposed in the tester and to slide parallel to the load plate, the shuttle plate having plural vias to allow the plural probes to pass through and plural blind vias formed adjacent the load plate; and
intermediary members extending from the load plate towards the shuttle plate, the intermediary members resting against the shuttle plate in a first position and inserting into the blind vias in a second position;
wherein the intermediary members space the load plate from the plural probes in the first position so that at least some of the plural probes have insufficient length to reach the circuit board under test and at least some of the plural probes have sufficient length to reach the circuit board under test;
wherein the shuttle plate slides relative to the load plate to bring the intermediary members to the second position so that at least some of the plural probes having insufficient length to reach the circuit board in the first position and to have sufficient length to reach the circuit board in the second position; and
wherein the intermediary members include at least four members disposed proximate each corner of a socket integrated in the circuit board.

13. The system of claim 12 wherein the intermediary members recede into the blind vias in the second position so that all of the plural probes have sufficient length to reach the circuit board under test.

14. The system of claim 13 further comprising a vacuum source interfaced with the tester to generate a vacuum, the vacuum biasing the load plate towards the plural probes.

* * * * *